United States Patent [19]

Ishikawa

[11] Patent Number: 4,877,710
[45] Date of Patent: Oct. 31, 1989

[54] METHOD FOR FORMING AN IMAGE COMPRISING ADHERENCE OF THE IMAGE-RECEIVING AND IMAGE-FORMING MATERIAL

[75] Inventor: Minoru Ishikawa, Kanagawa, Japan

[73] Assignee: Fuji Photo Film Co., Ltd., Kanagawa, Japan

[21] Appl. No.: 127,308

[22] Filed: Dec. 2, 1987

[30] Foreign Application Priority Data

Dec. 2, 1986 [JP] Japan .................. 61-286001

[51] Int. Cl.$^4$ .................. G03C 1/72; G03C 5/54
[52] U.S. Cl. .................. 430/138; 430/211; 430/235; 430/236; 430/252; 430/270; 430/281
[58] Field of Search .............. 430/138, 252, 281, 270, 430/211, 235, 236

[56] References Cited

U.S. PATENT DOCUMENTS

| | | | |
|---|---|---|---|
| 2,543,181 | 2/1951 | Land .................. | 430/212 |
| 4,440,846 | 4/1984 | Sanders et al. .................. | 430/138 |
| 4,500,624 | 2/1985 | Aono et al. .................. | 430/138 |
| 4,554,235 | 11/1985 | Adair et al. .................. | 430/138 |
| 4,560,637 | 12/1985 | Malda et al. .................. | 430/202 |
| 4,624,910 | 11/1986 | Takeda .................. | 430/203 |
| 4,629,676 | 12/1986 | Hayakawa et al. .................. | 430/203 |
| 4,649,098 | 3/1987 | Takeda .................. | 430/270 |
| 4,737,822 | 4/1988 | Tanigachi et al. .................. | 355/27 |

FOREIGN PATENT DOCUMENTS

| | | | |
|---|---|---|---|
| 23025 | 2/1983 | Japan .................. | 430/138 |
| 113860 | 8/1983 | United Kingdom .................. | 430/138 |

Primary Examiner—Paul R. Michl
Assistant Examiner—Patrick A. Doody
Attorney, Agent, or Firm—Sughrue, Mion, Zinn, Macpeak & Seas

[57] ABSTRACT

A method for forming an image comprising the steps of:
(a) imagewise exposing a light-sensitive material comprising a support having thereon a light-sensitive layer containing an image-forming material encapsulated in microcapsules comprising a polymer;
(b) superposing thereon an image-receiving material comprising a support having thereon an image-receiving layer in contact with the outermost layer of said light-sensitive material;
(c) applying sufficient pressure to said superposed materials to imagewise rupture at least part of said microcapsules, to transfer an image from said light-sensitive layer to said image-receiving layer, and to adhere said light-sensitive material and said image-receiving material to form a unitary structure; at least one of said support for said light-sensitive material and said support for said image-receiving material being transparent.

3 Claims, 1 Drawing Sheet

METHOD FOR FORMING AN IMAGE COMPRISING ADHERENCE OF THE IMAGE-RECEIVING AND IMAGE-FORMING MATERIAL

FIELD OF THE INVENTION

This invention relates to an image forming process, and more particularly to a method for forming a transferred image using pressure-sensitive materials.

BACKGROUND OF THE INVENTION

One image recording material utilizing microcapsules containing a light-sensitive composition employs synthetic high molecular resin microcapsules containing a vinyl compound, a photopolymerization initiator, and a coloring agent precursor as disclosed in U.S. Pat. No. 4,399,209. In the image recording process using the system, the microcapsules are imagewise hardened by imagewise exposure, unhardened microcapsules are ruptured by pressing, and color images are obtained from the coloring agent precursors thus released from the microcapsules. By easy processing of this dry system, images having high quality are obtained. However the system also has a disadvantage that the light sensitivity of the light-sensitive material is quite low as compared to silver halide materials.

A recording material having high light sensitivity and capable of giving images having high quality by easy dry processing overcoming this difficulty is disclosed in U.S. patent application Ser. No. 868,385 filed by Fuji Photo. Film Co., Ltd. In the recording material, at least a light-sensitive silver halide, a reducing agent, a polymerizable compound, and a color image-forming material are coated on a support, and at least the polymerizable compound and the color image-forming material are encapsulated in the same microcapsules.

An image recording process using the abovedescribed light-sensitive material is also disclosed in U.S. patent application Ser. No. 868,385 filed by Fuji Photo Film Co., Ltd. According to the image recording process, latent images are first formed by imagewise exposing the light-sensitive material and the light-sensitive material is developed by heating, whereby the polymerizable compound is polymerized in the portions having latent images to form a polymer and to harden the microcapsules. Then, the light-sensitive material is superposed on an image-receiving material having an image-receiving layer capable of receiving the color image-forming material, followed by pressing them to rupture at least a part of the microcapsules in the portions having no latent image, whereby the color image-forming material is transferred onto the image-receiving material to form images on the image-receiving material.

Also, an image-recording apparatus capable of using the above-described light-sensitive material for automatically performing all the steps of heat developing the light-sensitive material after imagewise exposure, superposing the light-sensitive material on an image-receiving material, and pressing the assembly to obtain images on the image-receiving material by image transfer is disclosed, for example, in Japanese Patent Application (OPI) No. 209461/87 filed Fuji Photo Film Co., Ltd. (The term "OPI" as used herein means an "unexamined published application".)

In such an image-recording process, a layer of the image-receiving material contains a developer. After heat-developing the light-sensitive material, the light-sensitive material is superposed on the image-receiving material followed by pressing them to transfer an image onto the image-receiving material, and after transferring the image, the unnecessary light-sensitive material is separated from the image-receiving material and discarded. However, since the apparatus used requires a means for separating the light-sensitive material from the image-receiving material as well as a means for transporting the light-sensitive material after separation and a means for discarding the light-sensitive material, the image-recording apparatus is complicated in design and large in size.

SUMMARY OF THE INVENTION

An object of this invention is to provide a simplified image-forming process using a simplified image-recording apparatus. It has now been found that this and other objects of the present invention can be obtained by a method for forming an image by the steps of:

(a) imagewise exposing a light-sensitive material composed of a support having thereon a light-sensitive layer containing an image forming material encapsulated in microcapsules composed of a polymer;

(b) superposing thereon an image-receiving material composed of a support having thereon an image-receiving layer in contact with the outer-most layer of the light-sensitive material;

(c) applying sufficient pressure to the superposed materials to imagewise rupture at least part of the microcapsules to transfer an image from the light-sensitive layer to the image-receiving layer and to adhere the light-sensitive material and the image-receiving material to form a unitary structure; at least one of the support for the light-sensitive material and the support for the image-receiving material being transparent.

DETAILED DESCRIPTION OF THE INVENTION

Figure 1:
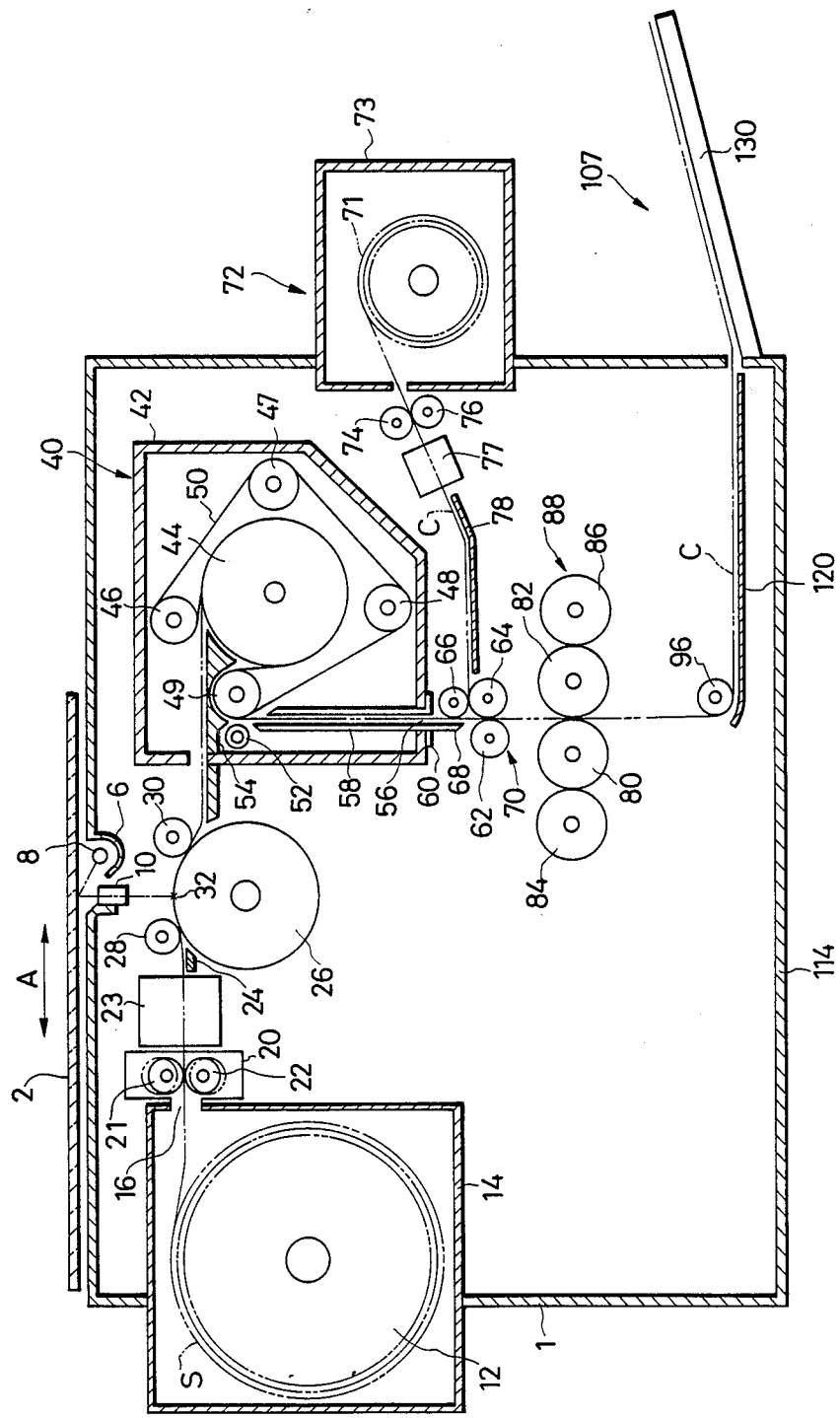
FIG. 1 is a cross sectional view showing an example of one image-recording apparatus for practicing the process of this invention.

In the process of this invention, by forming images using a light-sensitive material and an image-receiving material, at least one of these materials having a transparent support, the images formed can be viewed through the light-sensitive material or the image-receiving material without separating the light sensitive material from the image-receiving material after transferring the images.

In addition, the term "light-sensitive material" as used herein means a material for forming latent images by imagewise exposure and a material further capable of forming visible images by applying pressure to the latent images formed.

Furthermore, the process of this invention can be applied to both a system of hardening the exposed portions by polymerization and a system of softening the exposed portions by depolymerizing the exposed portions. In this specification, while the invention will be explained by reference to the photopolymerization example, the invention is not to be construed as being limited thereto.

In this case, the process of this invention may include a stop of heat development or wet development before applying pressure to the materials containing the latent images formed.

An example of a light-sensitive material for imagewise hardening a copolymerizable compound to form latent images and visualizing the latent images by applying pressure thereto is disclosed in Japanese Patent Application (OPI) No. 179836/82 by Fuji Photo Film Co., Ltd. The light-sensitive material is composed of a support having thereon synthetic high molecular resin capsules containing a vinyl compound, a photopolymerization initiator, and a coloring material precursor.

Also, a light sensitive material containing silver halide, which is imagewise exposed, heat-developed to develop silver halide and at the same time to harden a polymerizable compound corresponding to the development, and then applying pressure to obtain visible images, is disclosed in Japanese Patent Application (OPI) No. 278849/86 by Fuji Photo Film Co., Ltd. The light-sensitive material disclosed in Japanese Patent Application (OPI) No. 278849/86 is used in such a manner that after performing heat development, the color image-forming material is transferred onto an image-receiving material having an image-receiving layer to form images on the image-receiving material. The light-sensitive material is composed of a support having coated thereon at least a light-sensitive silver halide, a reducing agent, a polymerizable compound, and a color image forming material, wherein at least the polymerizable compound and the color image-forming material are encapsulated in the same microcapsules.

A suitable image-recording apparatus which can be used for practicing the process of the present invention has a heat-developing means when using a light-sensitive material requiring heat development before fixing images by pressing, but does not have a heat-development means when using a light-sensitive material not requiring heat development.

One typical embodiment of the process according to the invention is explained in greater detail with reference to a light-sensitive material requiring heat development before transferring the images by pressing, and an apparatus suitable for performing the process, but the present invention is not to be construed as being limited thereto.

FIG. 1 is a cross sectional view showing an example of an image-recording apparatus for practicing the process of this invention.

In the image-recording apparatus, an original supporting glass plate 2 is attached to the upper surface of a housing 1 reversibly movable in the direction shown by A. That is, the glass plate 2 having an original (not shown) disposed thereon moves reversibly in direction A.

Under the glass plate 2 are disposed a lamp 8 with a reflection mirror for illuminating the original and also a fiber lens array 10 for forming the images of the original on a light-sensitive material S at a definite position (32).

To the side portion of the housing 1 is removably equipped a cartridge (14) containing a light sensitive material roll 12 having the light-sensitive material S wound in a roll. A pair of delivery rollers 21 and 22 for drawing out the light-sensitive material, said rollers being contained in a dark box 20, are disposed at an outlet 16 of the cartridge 14 and by the rollers 21 and 22, the light-sensitive material S wound round the roll 12 is drawn out by a definite length at a definite time or, if desired, is drawn back.

When the lead portion of the light-sensitive material S approaches to the rollers 21 and 22, the rollers move apart from each other as shown by the broken lines for facilitating the movement of the light-sensitive material S.

At the front portion of the dark box 20 (the term "front" is used for the travelling direction of the light-sensitive material) are disposed a cutter unit 23 for cutting the light-sensitive material S and a guide plate 24. Also, at the front portion of the guide plate 24 are disposed a supporting roller (or drum) 26 for the light-sensitive material to be imagewise exposed and two nip rollers 28 and 30 which are in contact with the supporting roller 26 under pressure. The light-sensitive material S guided by the guide plate 24 is brought into closely contact with the supporting roller 26 by means of the nip rollers 28 and 30 and is imagewise exposed to the reflected light from original placed on the glass plate 2 through the fiber lens array 10 at the portion 32 between the nip rollers 28 and 30, as the original is moved in a predetermined relation along axis A in the same direction.

At the front portion of the supporting roller 26 is a heat developing device 40 for developing by heating the image exposed light-sensitive material S. The heat development device S is composed of a development housing 42 having disposed therein a heating roller 44 heated to about 120° C., supporting rollers 46, 47, 48, and 49, an endless belt 50 supported by the aforesaid supporting rollers and wound round the heating roller 44 at a circular arc of 270°, and a nip roller 52 which is brought into contact with the supporting roller 49 under pressure.

The heat development device 40 further has a guide means 54 for guiding the light-sensitive material S sent from the supporting roller 26 onto the heating roller 44 and also for releasing the material from the heating roller 44 after heat development and a vertical guide means 58 for guiding the developed light-sensitive material S sent by the nip roller 52 to an outlet 56, the outlet 56 being equipped with a sensor 60 for detecting the leading edge of the light-sensitive material.

Under the outlet 56 is disposed as a means 70 for superposing the light-sensitive material on an image-receiving paper (C) composed of a pair of press rollers 62 and 64, a nip roller 66 which is in contact with the press roller 64 under pressure, and a guide member 68 for guiding the light-sensitive material S sent by the press roller 64 and the nip roller 66 to the contacted portion of the press rollers 62 and 64.

At the side portion of the means 70 for superposing the light-sensitive material on the image-receiving paper is disposed an image-receiving paper (C) supplying means 72. The image-receiving paper supplying means 72 is an image-receiving cartridge 73 supporting an image-receiving paper roll 71 mounted on a supporting axis, the cartridge 73 being removable from the housing 1. Outside the image-receiving paper cartridge 73 are disposed a pair of delivery rollers 74 and 76, a cuter unit 77, and a guide plate 78.

Below the means 70 for superposing the light-sensitive material on the image-receiving paper is disposed a transfer means 88 composed of a pair of press nip rollers 80 and 82 and back up rollers 84 and 96 for equalizing the pressing force for the press nip rollers 80 and 82 in their axis line direction. The press nip rollers 80 and 82 are pressed against each other, applying a pressure of 200-800 kg/cm$^2$, preferably 350-600 kg/cm$^2$ to the superposed materials.

At the front portion of the transfer means 88 is disposed an image-receiving paper taking up means 107 equipped with a tray 130 for receiving a superposed material, the tray projecting from the housing 1.

The image-recording apparatus further has control means (not shown) connected to the illuminating lamp 8, the delivery rollers 21 and 22 for light-sensitive material, the cutter unit 23, the original supporting glass plate 2, the sensor 60 for detecting the leading head of the light-sensitive material, and the means 70 for superposing the light-sensitive material on the image-receiving receiving paper, respectively. The image-recording apparatus is operated as follows.

That is, at the working preparation stage, i.e., the copying preparation stage of the image-recording apparatus, the leading edge portion of the light-sensitive material S is in the dark box 20 connected to the magazine 14.

Then, a copy start button (not shown) is pushed, the delivery rollers 21 and 22 advance the light-sensitive material S, and directly before the leading edge of the light-sensitive material reaches position 32, the illuminating lamp 8 is lighted to illuminate the original placed on the glass plate 2.

When the leading edge of the light-sensitive material reaches the position 32, the original-supporting glass plate 2 moves in the same direction as the advancing light-sensitive material at the same predetermined rate and the image of the original is projected on the light-sensitive material S to imagewise expose the light-sensitive material S. When the light-sensitive material S has advanced a predetermined length in the moving direction, a cutter unit 23 works to cut the light-sensitive material S. Thereafter, delivery rollers 21 and 22 rotate in the opposite direction to draw back the light-sensitive material S so that the leading edge of the light-sensitive material S is in the dark box 20.

The imagewise exposed and detached sheet of light-sensitive material S is sent to the heat development device 40 and pressed to the heating roller 44 by means of an endless belt 50, whereby the light-sensitive material is heated to about 120° C. and is developed. Then, when the leading edge of the developed light-sensitive material S is passed through the outlet 56, it is detected by the sensor 60.

In the image-receiving paper supplying means 72, the image-receiving paper C is drawn out from the image-receiving paper cartridge 73, synchronized with the timing of the start of the light exposure by pushing the copy start button, and after being cut to a definite length by cutter unit 77, the detached sheet of image-receiving paper is sent to a position where the leading edge of the paper is nipped by a press roller 64 and a nip roller 66, and at this position, the image-receiving paper C is stopped.

In the means 70 for superposing the light-sensitive material on the image-receiving paper, the sheet of image-receiving paper C is superposed on the sheet of light-sensitive material S, the assembly is sent to the transfer means 88, and pressed at a pressure of about 500 kg/cm$^2$ to transfer images onto the image-receiving paper. Thereafter, the assembly having the transferred images is set to a taking up tray 130 by means of a feed roller 96.

The image-recording apparatus is explained above with reference to a movable glass plate 2 supporting the original, but the process of the invention can also be performed using a fixed support for the original.

In this invention at least one of the support for the light-sensitive material S and the image-receiving paper C is a transparent material, and for forming images, the light-sensitive material S is imagewise exposed and images thus formed are transferred onto the image-receiving material.

In the above-described image-recording apparatus for practicing this invention, when, for example, the support for the light-sensitive material S is transparent, after imagewise exposure the light-sensitive material is superposed on the image-receiving paper C followed by pressing by means of a transfer means 88 to transfer images of the light-sensitive material S onto the image-receiving paper C. The light-sensitive material S and the image-receiving paper C are adhered to each other by, for example, pressing and heating. That is, by means of press nip rollers 80 and 82, the light-sensitive material S is adhered to the image-receiving paper C simultaneously with the transfer of images formed in the light-sensitive material S onto the image-receiving paper C to form a unitary structure. In this case, the images on the image-receiving paper C can be viewed through the transparent support of the light-sensitive material S.

When the image-receiving material is transparent, the images formed on the image-receiving material can be viewed through the transparent image-receiving material.

The present invention is now described in greater detail by reference to specific examples illustrating particular embodiments of the light-sensitive material S and the image-receiving paper C for use in the process of this invention, but the present invention is not to be construed as being limited thereto. Unless otherwise indicated, all parts, percents and ratios are by weight.

EXAMPLE

Preparation of Silver Halide Emulsion (A)

To an aqueous gelatin solution (containing 20 g of gelatin and 1 g of potassium bromide in 1,000 ml of water heated to 70° C.) were simultaneously added 600 ml of an aqueous solution of 70 g of potassium bromide and an aqueous silver nitrate solution (formed by dissolving 0.59 mol of silver nitrate in 600 ml of water) at a constant flow rate with stirring over a period of 50 minutes. 5 minutes after completion of the addition thereof, 100 ml of an aqueous solution containing 1.7 g of potassium iodide and an aqueous silver nitrate solution (formed by dissolving 0.01 mol of silver nitrate in 100 ml of water) were simultaneously added to the above mixture at a constant flow rate over a period of 5 minutes. Thus, a monodisperse tetradecahedral silver iodobromide emulsion having a mean grain size of 0.25 μm was prepared.

After desalting the silver halide emulsion thus prepared by washing with water, the emulsion was chemically sensitized at 60° C. with the addition of 5 mg of sodium thiosulfate and 20 mg of 4-hydroxy-6-methyl-1,3,3a,7-tetraazaindene. Furthermore, by adding 75 ml of a 1% methanol solution of sensitizing dye (a) having the following formula to the emulsion, silver halide emulsion (a) was obtained in an amount of 600 g.

Sensitizing Dye (a):

-continued

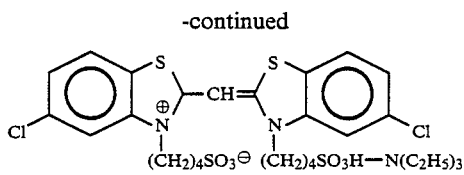

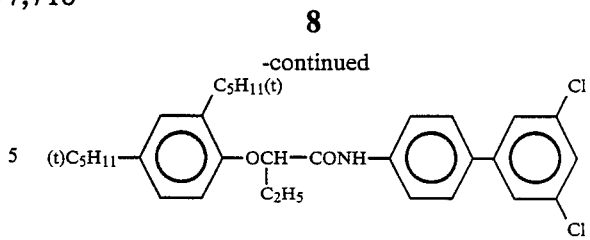

Reducing Agent II:

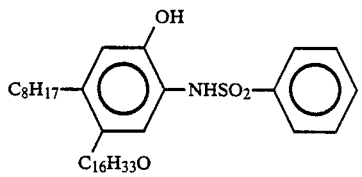

Preparation of Benzotriazole Silver Emulsion

In 3,000 ml of water were dissolved 28 g of gelatin and 13.2 g of benzotriazole. While stirring the solution at 40° C., a solution of 17 g of silver nitrate dissolved in 100 ml of water was added to the solution for a period of 2 minutes. Then, by adjusting the pH of the emulsion thus obtained, the excess salts were precipitated and removed. Thereafter, the pH of the emulsion was further adjusted to 6.30 to provide a benzotriazole silver emulsion. The amount of the emulsion obtained was 400 g.

Preparation of Light-Sensitive Composition (A)

In 100 g of trimethylolpropane triacrylate were dissolved 0.2 g of a copolymer shown below, 12 g of a dye image-forming material (a) shown below, and 2 g of Emalex NP-8, (trade name, made by Nippon Emulsion K.K.). Then, to 18 g of the solution thus formed was added a solution of 0.5 g of a reducing agent (I) shown below and 0.5 g of a reducing agent (II) shown below dissolved in 1.8 g of methylene chloride. Furthermore, 2 g of the silver halide emulsion (A) and 1 g of the benzotriazole silver emulsion prepared as described above were added to the mixture and the resultant mixture was stirred for 5 minutes using a homogenizer at 15,000 rpm to provide a light-sensitive composition (A):

Copolymer:

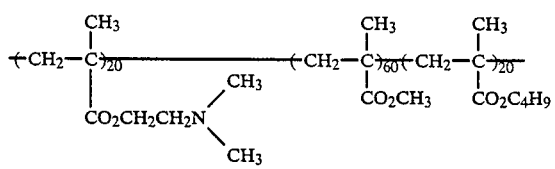

Dye Image-Forming Material (a):

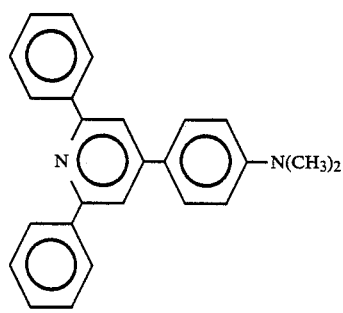

Reducing Agent I:

Preparation of Microcapsule Liquid (A)

To 10.51 g of a 18.6% aqueous Isoban, (made by Kuraray Co., Ltd.) was added 48.56 g of a 2.89% aqueous pectin and after adjusting the pH thereof to 4.0 using 10% sulfuric acid, the above-described light-sensitive composition (A) was added to the solution. Then, the resultant mixture was stirred for 2 minutes using a homogenizer at 7,000 rpm to emulsify the light-sensitive composition in an aqueous medium.

To 72.5 g of the aqueous emulsion thus obtained were successively added 8.32 g of a 40% aqueous urea, 2.82 g of a 11.3% aqueous resorcin, 8.56 g of a 37% aqueous formalin, and 2.74 g of a 8.76% aqueous ammonium sulfate, and then the resultant mixture was heated to 60° C. for 2 hours with stirring. Thereafter, the pH of the mixture was adjusted to 7.0 using a 10% aqueous sodium hydrocide and 3.62 g of a 30.9% aqueous sodium hydrogensulfite to provide a microcapsule liquid (A).

Preparation of Light-Sensitive Material (S)

A coating liquid was prepare by adding 1.0 g of a aqueous anionic surface active agent shown below and 3.0 g of a 10% quanidine trichloroacetate solution (waterethanol=50/50 in volume ratio) of to 10.0 g of the microcapsule liquid (A) prepared as described above. The coating liquid was coated on a transparent polyethylene terephthalate film 60 μm thick at a thickness of 40 μm and dried at about 40° C. to provide a light-sensitive material (S).

Anionic Surface Active Agent:

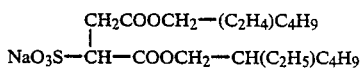

Preparation of Image-Receiving Paper

To 125 g of water was added 11 g of a 40% aqueous sodium hexametaphosphate and after further adding thereto 34 g of zinc 3,5-di-α-methylbenzylsalicylate and 82 g of a slurry of 55% calcium carbonate, the mixture was dispersed by means of a mixer. The liquid was further dispersed by means of a dynamil dispersing machine and then after adding 6 g of a latex of 50% butadiene-styrene rubber (SBR) and 55 g of a solution of 8% polyvinyl alcohol to 200 g of the dispersion thus obtained, the mixture was uniformly mixed. The mixture was uniformly coated on an art paper having a basis weight of 43 g/m² at a wet thickness of 40 μm and dried to provide an image-receiving paper.

After applying imagewise exposure to the light-sensitive material S (as shown in FIG. 1), the light-sensitive material was superposed on the image-receiving paper prepared above and when the assembly was heated by means of the heat development device 40 at 125° C. for 20 sec. directly before the press nip rollers 80 and 82 and then pressed by the press nip rollers at 500 kg/cm², the light-sensitive material and the image-receiving paper were well adhered to each other without an adhesive layer, and good transferred images were obtained.

If desired, however, the light-sensitive material may be adhered to the image-receiving paper by applying an adhesive on the surface of the light-sensitive material or the image-receiving paper. Furthermore, the light-sensitive material may be adhered to the image-receiving paper by a separate pressing or heating step.

In addition, when the support for the light-sensitive material is formed by a transparent material, the light-sensitive material may be exposed from the support side. Also, when the image-receiving material is transparent, the images transferred onto the image-receiving material can be viewed through the image-receiving material. Furthermore, when the supports of both the light-sensitive material and the image-receiving material are transparent, the images formed can be viewed from both sides and the images can be projected using a projector such as an overhead projector, etc. Moreover, by matting the back surface of the support of the light-sensitive material and/or the back surface of the image-receiving material, it is possible to write on the matte surface.

In the above-described image-recording apparatus, the light-sensitive material S is superposed on the image-receiving paper after cutting them to definite lengths, but both the light-sensitive material S and the image receiving paper C may be sent to the means 70 for superposing the light-sensitive material on the image-receiving paper in uncut form, and may be cut into definite lengths simultaneous with superposing the light-sensitive material on a the image-receiving paper C. Furthermore, either of the light-sensitive material and the image-receiving paper C may be sent in a cut sheet form or a uncut form.

In addition, although the image-forming process is explained with reference to an embodiment having a heat development step, when using light-sensitive materials of a type not requiring heat development, the heat development step is omitted. To promote adhesion between the light-sensitive material and the image-receiving paper, it is preferred that the process include a heat development step, and a heat-developable light-sensitive material is preferably used in the process of this invention.

As described above, since according to the process of this invention, at least one of the support for the light-sensitive material and the support for the image-receiving material is transparent, after superposing the developed light-sensitive material on the image-receiving material to transfer images formed in the light-sensitive material onto the image-receiving material, the images formed on the image-receiving material can be viewed through the light-sensitive material or the image-receiving material without separating the light-sensitive material from the image-receiving material. Also, in the process of this invention, the troublesome step of discarding used light-sensitive materials is not required.

Accordingly, the image-recording apparatus for practicing the process of this invention may have a simple construction without need of a means for separating the light-sensitive material, etc., and can be small-sized.

Also, in the recorded products obtained by the process of this invention, the transparent support of the light-sensitive material and/or the transparent image-receiving material protects images from light fading, physical abrasion, water wetting, etc., and hence the storage stability of images can be improved without the need of a specific fixing step. Also, since two sheets are superposed on each other to form one sheet in the process of this invention, the thickness of each sheet can be reduced to reduce the cost thereof.

While the invention has been described in detail and with reference to specific embodiments thereof, it will be apparent to one skilled in the art that various changes and modifications can be made therein without departing from the spirit and scope thereof.

What is claimed is:

1. A method for forming an image comprising the steps of:
    (a) imagewise exposing a light-sensitive material comprising a support having thereon a light-sensitive layer containing an image-forming material encapsulated in synthetic high molecular resin microcapsules containing a vinyl compound, a photo-polymerization initiator, and a color dye precursor as an image-forming material;
    (b) superposing thereon an image-receiving material comprising a support having thereon an image-receiving layer in contact with the outermost layer of said light-sensitive material;
    (c) applying sufficient pressure to said superposed materials to imagewise rupture at least part of said microcapsules, to transfer an image from said light-sensitive layer to said image-receiving layer, and to adhere said light-sensitive material and said image-receiving material to form a unitary structure; at least one of said support for said light-sensitive material and said support for said image-receiving material being transparent.

2. The method as claimed in claim 1, wherein said pressure is 350–600 kg/cm².

3. A method for forming an image comprising the steps of:
    (a) imagewise exposing a light-sensitive material comprising a support having there on a light-sensitive layer comprising a light-sensitive silver halide, a reducing agent, a polymerizable compound, and a color image-forming material, with at least said polymerizable compound and said color image-forming material being encapsulated in microcapsules including a polymer;
    (b) superposing thereon an image-receiving material comprising a support having thereon an image-receiving layer in contact with the outermost layer of said light-sensitive material;
    (c) applying sufficient pressure to said superposed materials to imagewise rupture at lest part of said microcapsules, to transfer an image from said light-sensitive layer to said image-receiving layer, and the adhere said light-sensitive material and said image-receiving material to form a unitary structure; at least one of said support for said light-sensitive material and said support for said image-receiving material being transparent.

* * * * *